US006478924B1

(12) United States Patent
Shamouilian et al.

(10) Patent No.: US 6,478,924 B1
(45) Date of Patent: Nov. 12, 2002

(54) PLASMA CHAMBER SUPPORT HAVING DUAL ELECTRODES

(75) Inventors: Shamouil Shamouilian, San Jose; Arnold Kholodenko, San Francisco; Kwok Manus Wong, San Jose; Liang-Guo Wang, Milpitas; Alexander M. Veytser, Mountain View, all of CA (US); Dennis S. Grimard, Ann Arbor, MI (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/513,992

(22) Filed: Mar. 7, 2000

(51) Int. Cl.[7] .............................................. H05H 1/00
(52) U.S. Cl. ............................ 156/345.48; 156/345.51; 118/723 I; 118/728; 361/234; 279/128
(58) Field of Search ................ 156/345.48, 345.51; 118/723 I, 723 E, 728; 361/234; 279/128

(56) References Cited

U.S. PATENT DOCUMENTS

| 3,617,459 A | 11/1971 | Logan | 204/192 |
| 4,184,188 A | 1/1980 | Briglia | 361/234 |

(List continued on next page.)

FOREIGN PATENT DOCUMENTS

| EP | 0439000 | 1/1991 |
| EP | 0601788 | 12/1993 |
| EP | 0692814 | 1/1996 |
| JP | 1-298721 | 5/1988 |
| JP | 6-182645 | 12/1992 |
| JP | 7150360 | 6/1995 |
| WO | 9514308 | 5/1995 |

OTHER PUBLICATIONS

PCT Communication dated Dec. 6, 2001, European Patent Office, P.B. 5818 Patentlaan 2, NL–2280 HV Rijswijk.

Daviet, J., et al., "Electrostatic Clamping Applied to Semiconductor Plasma Processing—I. Theoretical Modeling," *J. Electrochem. Soc.*, vol. 140, No. 11, Nov. 1993; pp. 3245–3255.

Daviet, J., et al., "Electrostatic Clamping Applied to Semiconductor Plasma Processing—II. Experimental Results," *J. Electrochem. Soc.*, vol. 140, No. 11, Nov. 1993; pp. 3256–3261.

U.S. Patent Application entitled, Inductively Coupled RF Plasma Reactor Having an Overhead Solenoidal Antenna; filed May 13, 1996; Ser. No. 08/648,254; Inventors: Collins, et al.

U.S. Patent Application entitled, "Improving Plasma Process Performance by Filtering Plasma Sheath–generated Harmonics"; filed Apr. 4, 1997; Ser. No. 08/832,743; Inventors: Roderick, et al.

U.S. Patent Application entitled, "Parallel–plate Electrode Plasma Reactor Having an Inductive Antenna and Adjustable Radial Distribution of Plasma Ion Density"; filed Oct. 24, 1996; Ser. No. 08/740,124; Inventors: Collins, et al.

*Primary Examiner*—Thi Dang
(74) *Attorney, Agent, or Firm*—Ashok Janah; Joseph Bach

(57) ABSTRACT

A process chamber 110 capable of processing a substrate 50 in a plasma comprises a dielectric 210 covering a first electrode 220 and a second electrode 230, a conductor 250 supporting the dielectric 210, and a voltage supply 170 to supply an RF voltage to the first electrode 220 or the second electrode 230 in the dielectric 210. The first electrode 220 capacitively couples with a process electrode 225 to energize process gas in the process chamber 110 and RF voltage applied to the second electrode 230 is capacitively coupled to the conductor 250 and through a collar 260 or the second electrode 230 is directly capacitively coupled through the collar 260.

42 Claims, 5 Drawing Sheets

U.S. PATENT DOCUMENTS

| | | |
|---|---|---|
| 4,368,092 A | 1/1983 | Steinberg et al. ............ 489/678 |
| 4,384,918 A | 5/1983 | Abe ........................... 156/643 |
| 4,399,016 A | 8/1983 | Tsukada et al. .......... 204/192 R |
| 4,665,463 A | 5/1987 | Ward et al. .................. 361/234 |
| 4,771,730 A | 9/1988 | Tezuka ....................... 118/723 |
| 5,055,964 A | 10/1991 | Logan et al. ................ 361/234 |
| 5,104,834 A | 4/1992 | Watanabe et al. ........... 501/127 |
| 5,151,845 A | 9/1992 | Watanabe et al. ........... 361/234 |
| 5,155,652 A | 10/1992 | Logan et al. ................ 361/234 |
| 5,166,856 A | 11/1992 | Liporace et al. ............ 361/233 |
| 5,191,506 A | 3/1993 | Logan et al. ................ 361/234 |
| 5,215,619 A | 6/1993 | Cheng et al. ............... 156/345 |
| 5,221,450 A | 6/1993 | Hattori et al. ......... 204/192.32 |
| 5,225,024 A | 7/1993 | Hanley et al. .............. 156/345 |
| 5,238,499 A | 8/1993 | Van De Ven et al. ....... 118/724 |
| 5,241,245 A | 8/1993 | Barnes et al. ........... 315/111.41 |
| 5,255,153 A | 10/1993 | Nozawa et al. |
| 5,280,156 A | 1/1994 | Niori et al. ................. 219/385 |
| 5,350,479 A | 9/1994 | Collins et al. .............. 156/345 |
| 5,376,213 A | 12/1994 | Ueda et al. ................. 156/345 |
| 5,382,469 A | 1/1995 | Kubota et al. .............. 428/332 |
| 5,401,350 A | 3/1995 | Patrick et al. .............. 156/345 |
| 5,413,360 A | 5/1995 | Atari et al. ................. 279/128 |
| 5,423,945 A | 6/1995 | Marks et al. ............. 156/662.1 |
| 5,449,977 A | 9/1995 | Nakagawa et al. ..... 315/111.51 |
| 5,463,526 A | 10/1995 | Mundt ........................ 361/234 |
| 5,531,862 A * | 7/1996 | Otsubo et al. |
| 5,571,366 A | 11/1996 | Ishii et al. .................. 156/345 |
| 5,597,438 A | 1/1997 | Grewal et al. .............. 156/345 |
| 5,629,653 A | 5/1997 | Stimson ..................... 333/17.3 |
| 5,631,803 A | 5/1997 | Cameron et al. ........... 361/234 |
| 5,646,814 A | 7/1997 | Shamouilian et al. ....... 361/234 |
| 5,647,913 A | 7/1997 | Blalock .................... 118/723 I |
| 5,684,669 A | 11/1997 | Collins et al. .............. 361/234 |
| 5,707,486 A | 1/1998 | Collins ..................... 156/643.1 |
| 5,720,818 A | 2/1998 | Donde et al. ............... 118/500 |
| 5,726,097 A | 3/1998 | Yanagida .................... 438/622 |
| 5,751,537 A | 5/1998 | Kumar et al. |
| 5,754,391 A | 5/1998 | Bates ......................... 361/234 |
| 5,795,452 A | 8/1998 | Kinoshita et al. ...... 204/298.37 |
| 5,800,618 A | 9/1998 | Niori et al. ............... 118/723 E |
| 5,834,371 A | 11/1998 | Ameen et al. .............. 438/656 |
| 5,904,799 A * | 5/1999 | Donohoe .................... 156/345 |
| 6,074,488 A | 6/2000 | Roderick et al. |
| 6,095,084 A | 8/2000 | Shamouilian et al. |
| 6,287,986 B1 * | 9/2001 | Mihara ....................... 438/763 |

* cited by examiner

PLASMA CHAMBER SUPPORT HAVING DUAL ELECTRODES

BACKGROUND

The present invention relates to a support for supporting a substrate during processing in a plasma.

An ionized gas or plasma is used in many types of manufacturing processes, including for example, processes for the fabrication of semiconductors and other active or passive electronic devices. For example, plasmas are used in chemical vapor deposition, etching, and ion implantation processes. In a conventional chamber, a gas distributor provides process gas therein, and an RF voltage is applied to a cathode below the substrate while an anode is electrically grounded to energize the gas to form a plasma. However, conventional plasma chambers often do not provide a uniform plasma across the surface of the substrate because of variations in the RF energy across the substrate. For example, in one chamber design, the peripheral portion of the cathode extends circumferentially around the substrate and a relatively thick insulator shield is used to electrically isolate the peripheral cathode portion. However, the insulator shield covering the cathode reduces the RF current between the cathode and the plasma at the periphery of the substrate. The resultant non-uniform plasma across the surface of the substrate can cause the peripheral portion of the substrate to be non-uniformly processed relative to the central portion of the substrate. Plasma processing may also be nonuniform when the cathode does not extend all the way to the peripheral edge of the substrate, as for example in chambers where the cathode has a diameter slightly smaller than that of the substrate. As a result of these effects, the peripheral substrate portion has often reduced yields by as much as 10 to 30%.

Thus, there is a need for a chamber capable of providing a uniform plasma across the substrate surface, and in particular, across the peripheral edge of the substrate. There is also a need for a chamber that allows extending the plasma beyond the peripheral edge of the substrate. There is a further need for a method of processing a substrate that provides consistent processing across the surface of the substrate and especially at the peripheral edge of the substrate.

SUMMARY

The present invention satisfies these needs. In one aspect, the present invention comprises a support capable of supporting a substrate in a chamber. The support comprises a dielectric which covers first and second electrodes and has a surface which is adapted to receive the substrate. A voltage supply is adapted to supply an RF bias voltage to the first and second electrodes.

In another aspect of the present invention, a process chamber is capable of processing a substrate in a plasma. The process chamber comprises a gas distributor adapted to introduce process gas in the chamber; a dielectric comprising a first and a second electrode, the dielectric having a receiving surface adapted to receive the substrate; a conductor below the dielectric; a voltage supply adapted to supply a gas energizing voltage to both of the electrodes; and a collar on the conductor.

In another aspect, a method comprises the steps of supporting a substrate in the process chamber, introducing process gas in the process chamber, supplying a voltage to a first electrode to energize the process gas, and supplying a voltage to a second electrode to energize the process gas.

Another method comprises the steps of supporting the substrate on a support in the process chamber, introducing process gas into the process chamber, supplying a voltage to a first electrode to energize the process gas, and supplying a voltage to a second electrode to remove deposits on the support.

DRAWINGS

These features, aspects, and advantages of the present invention will become better understood with regard to the following description, appended claims, and accompanying drawings which illustrate examples of the invention. However, it should be understood that each of the features can be used in the invention in general, not merely in the context of the particular drawings, and the invention includes any combination of these features, where:

DESCRIPTION

Figure 1:
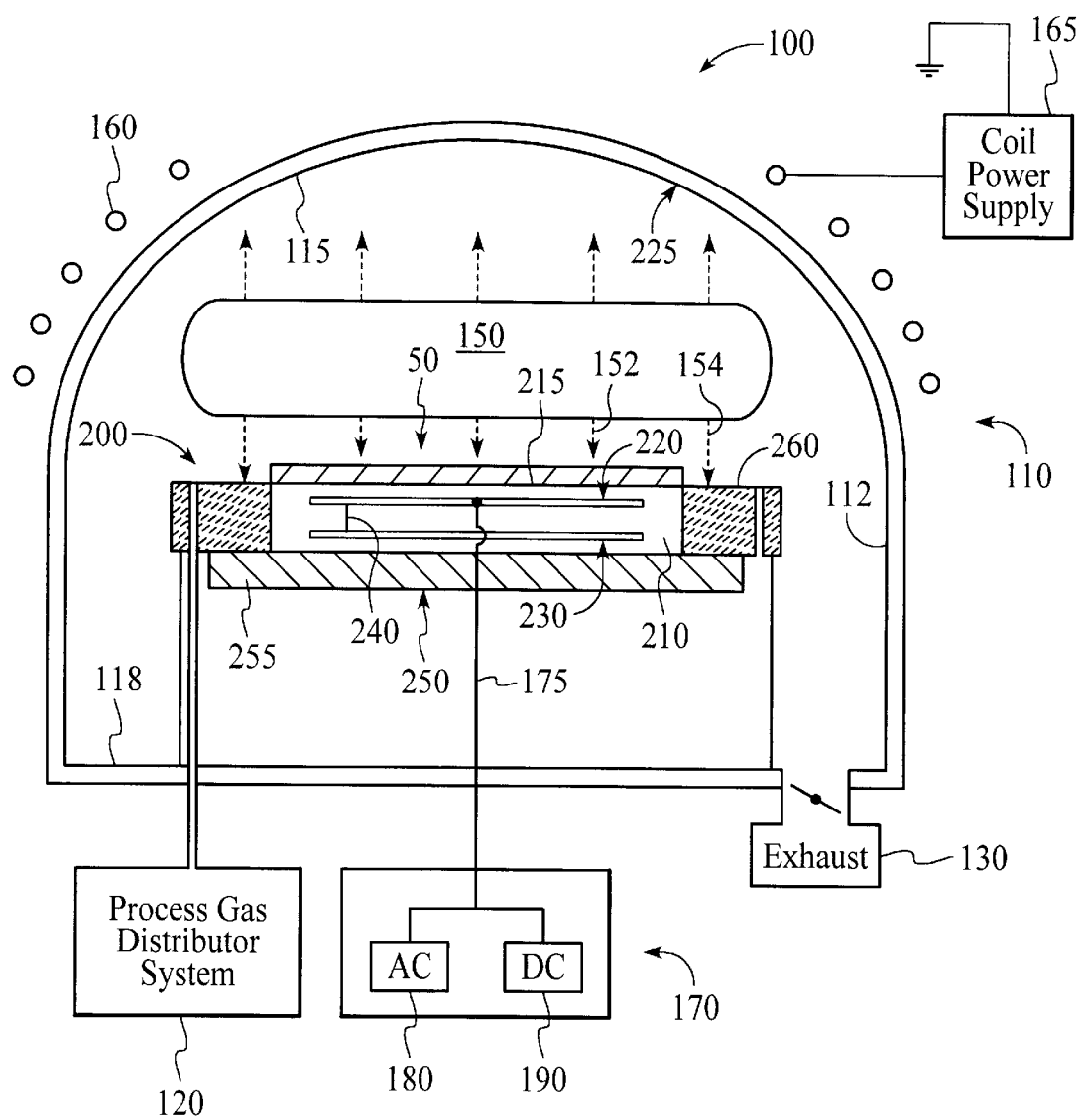
FIG. 1 is a schematic sectional side view of an embodiment of a substrate processing apparatus with a embodiment of a dual electrode support.
Figure 2:
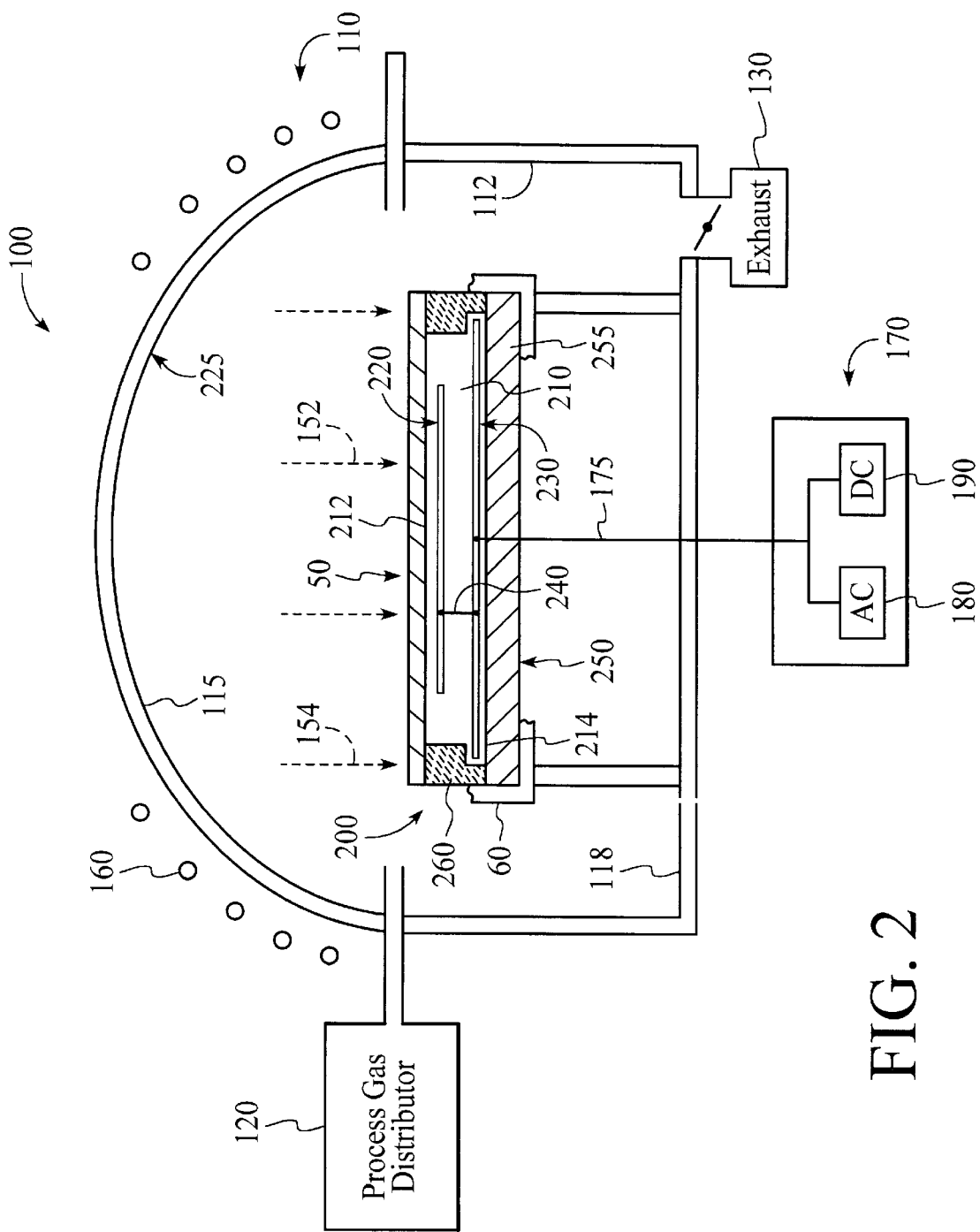
FIG. 2 is a schematic sectional side view of another embodiment of a substrate processing apparatus with another embodiment of a dual electrode support.
Figure 3:
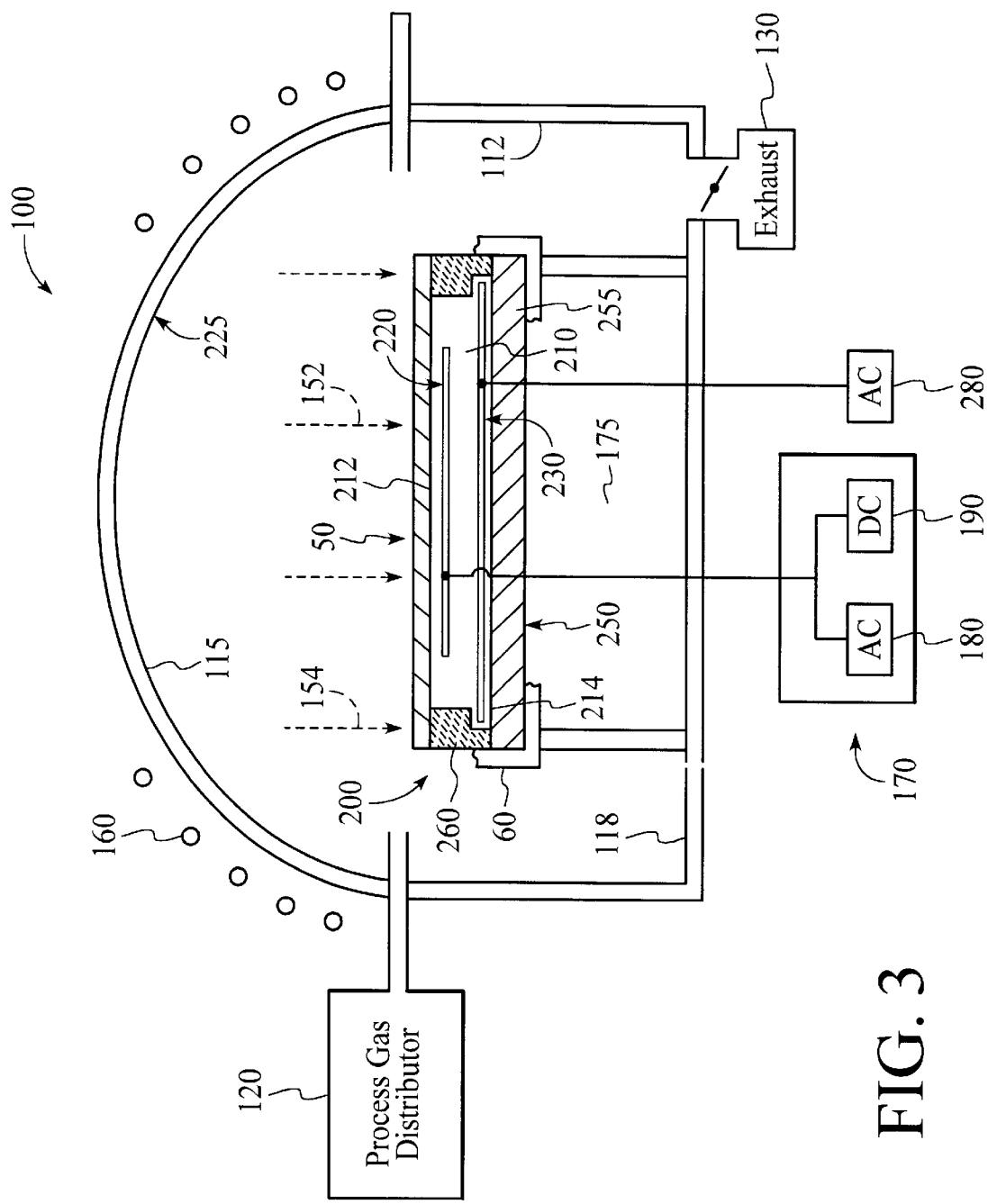
FIG. 3 is a schematic sectional side view of another embodiment of a substrate processing apparatus with another embodiment of a dual electrode support.

The present invention relates to an apparatus that is used to support a substrate 50 while, for example, etching the substrate 50 by a plasma, implanting material in the substrate 50 by ion implantation, depositing material on a substrate 50 by chemical vapor deposition or sputtering or performing other processes. An exemplary plasma processing apparatus 100, suitable for processing a substrate, such as a semiconductor wafer 50, is shown in FIG. 1 and generally comprises an enclosed process chamber 110 having sidewalls 112, a ceiling 115, and a bottom wall 118. The process chamber 110 and the various components therein can be made from a variety of materials including metals, ceramics, glasses, polymers and composite materials, using conventional machining and molding methods. Metals that can be used to fabricate the process chamber 110 and components therein, include aluminum, anodized aluminum, "HAYNES 242," "Al-6061," "SS 304," "SS 316," and INCONEL, of which anodized aluminum is preferred. Process gas is introduced into the chamber 110 through a gas distributor system 120 which may include a process gas supply, a gas flow control system, and flow meters. The process gas is introduced adjacent to the periphery of the substrate 50, as shown in FIGS. 1–3, or from above the substrate 50 through a perforated "showerhead" gas diffuser capable of distributing process gas substantially uniformly across the substrate (not shown). An exhaust system 130, comprising one or more exhaust pumps and throttle valves, is used to exhaust spent process gas byproducts and to control the pressure of process gas in the chamber 110. Typically, a computer control system operates the gas distributor system 120 and the exhaust system 130 using programmed process conditions. The particular embodiment of the apparatus shown herein is provided only to illustrate operation of the invention and should not be used to limit the scope of the invention.

After the process gas is introduced into the chamber 110, the gas may be energized to form a plasma 150. One or more inductor coils 160 may be provided adjacent to the chamber 110. A coil power supply 165 powers the inductor coil 160 to inductively couple RF energy to the process gas to form the plasma 150. Alternatively, or in addition, process electrodes comprising a cathode below the substrate 50 and an anode above the substrate 50 may be used to couple RF power to the plasma in a manner to be described below. A power source 170 comprising an AC source 180 and a DC source 190 may be used to supply power to the process electrodes.

A support 200 for holding the substrate 50 and for energizing the process gas is positioned within the chamber 110. The support 200 comprises a dielectric 210 having a substrate supporting surface 215. The dielectric 210 covers two electrodes 220, 230 and optionally, the electrodes 220, 230 may be embedded in the dielectric 210. The two electrodes 220, 230 may be electrically connected by connector 240, such as molybdenum wire, conductive paste vias, or the like. In one embodiment, the dielectric 210 surrounds the top electrode 220 in a manner that allows the top electrode 220 to serve as a plasma energizing electrode. A process electrode 225 comprising a conductor element is positioned in the chamber 110 over the substrate 50 and may be sufficiently large to encompass substantially the entire area of the substrate 50. By applying an RF voltage from voltage supply 170 to the top electrode 220, the top electrode and the process electrode 225 capacitively couple to form an RF electric field in the chamber 110, as described in U.S. patent application Ser. No. 08/893,599 filed on Jul. 14, 1997, and entitled "High Density Plasma Process Chamber," which is incorporated herein by reference.

The process electrode 225 may be the ceiling 115 or a sidewall of the chamber 110 which serves as a conductor which may be biased or grounded. The process electrode 225 may also be a semiconductor that provides low impedance to an RF induction field transmitted by the induction antenna 160. The semiconductor ceiling 115 or sidewall is sufficiently electrically conductive to serve as the process electrode 225 and may also be permeable to an RF induction field generated by the inductor antenna 160 above the ceiling 115. The ceiling 115 may comprise, for example, silicon, silicon carbide, germanium, Group III-V compound semiconductors such as mercury-cadmium-telluride, or other known semiconductor materials. In one embodiment, the ceiling 115 comprises semiconducting silicon, which is used to lessen the contamination of silicon-containing substrates. The ceiling 115 of the process chamber 110 can be flat or rectangular shaped, arcuate, conical, dome-shaped, or multi-radius dome-shaped. In one version, the inductor antenna 160 is wrapped around the sidewall of the process chamber 110 in the form of a multi-radius dome-shaped inductor coil having a "flattened" dome shape that provides more efficient use of plasma source power and increased plasma ion density directly over the substrate 50 center.

The top electrode 220 in the dielectric 210 may also be supplied with a DC chucking voltage to electrostatically hold the substrate 50 on the support 200. The top electrode 220 may also be configured to carry both the RF bias voltage and the DC chucking voltage, both of which may be applied by power supply 170 though an electrical connection 175 such as a banana jack inserted through the dielectric 210 and connected to the top electrode 220. The voltage supply 170 includes an AC voltage source 180 for providing a plasma generating RF voltage to the top electrode 220 and optionally, a DC voltage source 190 for providing a chucking voltage to the top electrode 220. The AC voltage supply provides an RF generating voltage having one or more frequencies from, for example, 400 KHz to 60 MHz at a power level of typically from about 50 to about 3000 Watts. The DC voltage may be applied to the electrode 220 to provide an electrostatic charge that holds the substrate 50 to the chuck comprising a DC blocking capacitor circuit electrically connected to a DC chuck power supply. The voltage supply 170 can also include a system controller for controlling the operation of the electrode by directing a DC current, and RF current, or both, to the electrode for chucking and dechucking the substrate 50 and for sustaining or energizing a plasma in the process chamber 110. The DC chuck power supply typically provides a DC chucking voltage of about 200 to about 2000 volts to the electrode 220.

The top electrode 220 supplies an RF voltage to the bottom electrode 230 through the electrical connector 240. A floating electrical conductor 250 supports the dielectric 210 below the bottom electrode 230. By "floating" it is meant that the conductor 250 is not directly electrically connected to an external power source or to ground, or similar. A layer of dielectric material between the bottom electrode 230 and the conductor 250 allows the RF power supplied to the lower electrode 230 to capacitively couple from the lower electrode 230 to the conductor 250, as described in U.S. patent application Ser. No. 08/931,708, filed on Sep. 16, 1997, and entitled "Plasma Chamber Support Having an Electrically Coupled Collar Ring" which is incorporated herein by reference. A collar 260 may be positioned on a peripheral portion 255 of the electrical conductor 250 to allow RF power to be capacitively coupled from the peripheral portion 255 though the collar 260 to the plasma 150. It is believed this results in an extended plasma sheath having electric field components 154 that provide a uniform plasma for processing of the substrate 50. It is also believed that the capacitive coupling through the collar 260 allows a plasma self bias to build up and clean process deposits from the collar 260. These process deposits are generated, for example, by polymerizing species in the plasma and may generally be composed of fluorine and carbon compounds. The arrangement may also serve to strip off the DC component of the RF/DC electrode by allowing only RF-coupling to the conductor. Alternatively, the dielectric 210 may be sized and shaped to allow the second electrode 230 to directly capacitively couple through the collar 260.

FIG. 2 shows another embodiment of the apparatus 100 and the support 200. In this exemplary embodiment, the dielectric 210 includes a central portion 212 containing the top electrode 220 and an extended portion 214 containing the bottom electrode 230. This configuration allows for low arcing potential, simplified construction, and good coupling throughout. Also in the embodiment shown in FIG. 2, the power supply 170 supplies the RF voltage and the DC voltage via the electrical connector 175 to the bottom electrode 230. The bottom electrode 230 supplies the top electrode 220 via electrical connector 240 with the RF voltage necessary to energize the process gas and may also provide the top electrode 220 with the DC voltage necessary to electrostatically attract the substrate 50. In the version shown in FIG. 1, the top electrode 220 and the bottom electrode 230 sandwich a layer of dielectric 210, and the connector 240 extends through the sandwiched layer. In this version, the top electrode 220 and the bottom electrode 230 are substantially planar and are substantially parallel, or at least partially parallel.

FIG. 3 shows yet another embodiment of the apparatus 100 and the support 200 that is similar to the embodiment shown in FIG. 2. However, the electrical connector 240 between the two electrodes has been removed and a second RF voltage source 280 is provided to power the bottom electrode. In this embodiment, the powering of the top electrode 220 to energize the plasma and/or electrostatically hold the substrate 50 and the powering of the bottom electrode 230 to capacitively couple with the conductor 250 are more isolated. Although not shown in FIG. 3, a DC voltage may also be supplied to the bottom electrode 230. This DC voltage may, in one version, be used to electrostatically "chuck" the collar 260 which can provide advantageous heat transfer effects.

The support 200 is formed by covering, or embedding, the electrodes 220, 230 in the dielectric 210 which may comprise a dielectric material that serves to electrically insulate the electrodes 220, 230 and prevent electrical shorting to the plasma in the chamber 110. The dielectric 210 comprises a relatively low RF electrical field absorption that allows an RF electric field emanating from the top electrode 220 to be capacitively coupled through the dielectric 210. Alternatively, the dielectric 210 may also comprise a semiconductor material with a low level of conductivity. The dielectric 210 has a smooth receiving surface having an RMS peak to peak roughness of less than 10 microns, that directly contacts and supports the substrate 50. Preferably, the dielectric comprises a volume resistivity of from about $10^8$ Ωcm to about $10^{14}$ Ωcm to reduce current leakage to the substrate 50 and to allow for good chucking and dechucking performance. The dielectric 210 may be shaped and sized to match the shape and size of the substrate 50.

The dielectric 210 may comprise a unitary and discrete structure containing the electrodes 220, 230, and may be is fabricated as a monolithic structure from thermally fused ceramic or polymer. Monolith ceramics typically have low porosity, good electrical properties, and entirely enclose the electrodes 220, 230 which remove the need for insulator shields in the chamber 55. The high dielectric breakdown strength of the dense ceramic structure also allows application of higher RF power to the electrodes 220, 230. The dielectric 210 may be fabricated from a ceramic having a low porosity of less than about 20%, and preferably less than about 10%. Suitable ceramic materials include one or more of aluminum oxide, aluminum nitride, boron carbide, boron nitride, silicon oxide, silicon carbide, silicon nitride, titanium oxide, titanium carbide, yttrium oxide, and zirconium oxide. Alternatively, the dielectric 210 can comprise a laminate of polyimide or aramid layers stacked around the electrodes 220, 230, and typically fabricated by an autoclave pressure forming process, as disclosed in U.S. patent application Ser. No. 08/381,786, to Shamouilian, filed on Jan. 31, 1995, which is incorporated herein by reference. Alternatively, the dielectric 210 may comprise a semiconductor material such as undoped or doped ceramic materials, such as alumina, titania, silicon carbide, silicon nitride, aluminum nitride, boron nitride, boron carbide, yttrium oxide, zirconium oxide, and mixtures thereof. The thermal conductivity of the dielectric material is preferably a high conductivity of about 80 to about 240 Watts/m K, for example provided by aluminum nitride. The electrodes 220, 230 embedded in the dielectric medium may be fabricated from a conductive metal which allows thermal sintering of the dielectric with the embedded electrode. The dielectric 210 with the embedded electrodes 220, 230 can be fabricated by isostatic pressing, hot pressing, mold casting, or tape casting, from a mixture of ceramic powders and a low concentration of organic binder material.

The dielectric 210 can also comprise gas feed through holes (not shown) that extend therethrough for providing helium heat transfer gas to the receiving surface below the substrate 50. The helium gas feedthrough holes have a diameter sufficiently small to prevent plasma glow discharge of the helium in the holes, which is preferably from about 1 to 10 mils (25 to 250 microns), otherwise the helium gas forms plasma glow discharges or electrical arcing at the termination end of the hole. Typically, a series of gas feed-thorough holes are provided around its circumference to provide a uniform distribution of heat transfer gas to the region below the substrate 50.

Figure 4:
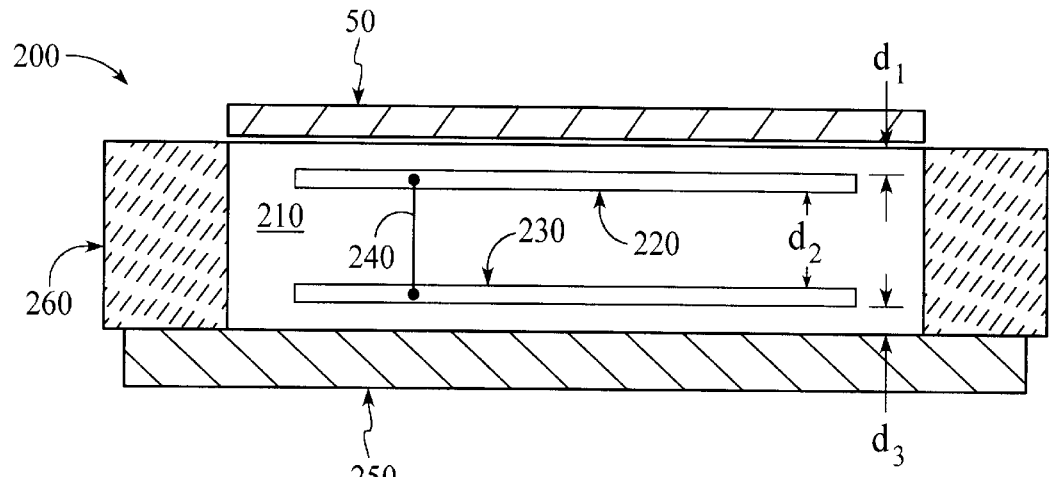
FIG. 4 is a schematic sectional side view of a embodiment of a dual electrode support usable with a substrate processing apparatus.

The electrical properties of the dielectric 210 are selected to obtain a low electrical conductivity of about $10^8$ to about $10^{14}$ ohms-cm. As shown in FIG. 4, the dielectric 210 comprises a cover layer that electrically insulates the top electrode 220 to prevent shorting of the plasma in the chamber 110 and to isolate the substrate 50 from the top electrode 220. The cover layer of dielectric 210 may be made from a dielectric material that is permeable to the RF energy supplied to the top electrode 220 to allow capacitive coupling through the cover layer to the plasma and the process electrode 225. The dielectric constant, electric field susceptibility, and thickness of the cover layer of dielectric 210 enhance capacitive coupling of the RF voltage applied to the top electrode 220 to the process electrode 225. In addition, the cover layer of dielectric 210 allows a DC voltage applied to the top electrode 220 to electrostatically hold the substrate 50 by Coulombic or Johnsen-Rahbek forces. Preferably, the cover layer comprises a dielectric constant of at least about 2. The support layer of the dielectric 210 that is between the top electrode 220 and the bottom electrode 230 may be sufficiently thick to add structural strength to the dielectric 210 and may or may not be sufficiently thick to limit electrical coupling between the electrodes 220, 230. For example, it may be desirable to electrically isolate the electrodes 220, 230 in the embodiment shown in FIG. 3.

The RF reactance of different layers of dielectric 210 is tailored to achieve the desired coupling/non-coupling therethrough. For example, the dielectric cover layer above the top electrode 220 may comprise an RF reactance of about 1 to about 500 Ohms, more preferably from about 1 to about 50 Ohms, and most preferably from about 1 to about 10 Ohms; and the support layer may comprises an RF reactance of about 100 to about 10000 Ohms, and more preferably 100 to 1000 Ohms. The minimum thickness of the dielectric layer above the top electrode 220 or below the bottom electrode 230 may be determined by the formula $C=(E_o E_r A)/L$; where L is the minimum thickness of the dielectric layer, A is the area, and $E_o$ and $E_r$ are the relative dielectric constants for the dielectric material and air. The thickness of the dielectric layer of the dielectric 210 that is above the top electrode 220, $d_1$, between the top electrode 220 and bottom electrode 230, $d_2$, and below the bottom electrode 230, $d_3$, depends upon the electrical properties of the dielectric material, such as dielectric constant, resistivity. The thickness, $d_1$, of the dielectric 210 above the top electrode 220 is sufficiently thin to allow the top electrode 220 to capacitively couple RF power to the plasma through the overlying substrate 50 without excessive attenuation of the RF power. A suitable thickness of the dielectric cover layer is from about 1 micron to about 5 mm, more preferably from about 10 microns to about 5 mm, and most preferably from about 100 microns to about 2 mm, for dielectric materials having a dielectric constant of about 2. The thickness, $d_3$, of the lower dielectric layer supporting the bottom electrode 230 may be sufficiently thin to allow the downward component of the electric field from the bottom electrode 230 to capacitively couple RF power from the underlying conductor 250 without excessive attenuation of the RF field. The thickness, $d_3$, of the dielectric material below the bottom electrode 230 can is set to control the delivery of RF power to the conductor 250 and subsequently to the collar 260. In one embodiment, the thickness, $d_3$, is from about 1 micron to about 5 mm, more preferably from about 100 microns to about 5 mm, and most preferably from about 500 microns to about 3 mm. The thickness, $d_2$, of dielectric material between the top electrode 220 and the bottom electrode 230 may be from about 1 micron to about 15 mm.

The electrodes 220, 230 may be fabricated from a conductive metal such as aluminum, copper, silver, gold, molybdenum, tantalum, titanium, or mixtures thereof. The conductive metals may comprise high melting point metals, such as copper, tantalum, tungsten, platinum, rhenium, hafnium, and alloys thereof, which are preferred when the dielectric is formed using high temperature processing. The electrodes 220, 230 can comprise a layer of conducting material, for example a copper layer from about 1 to 100 microns thick, that is embedded in the dielectric 210. Alternatively, the electrode can comprise a mesh of wire having a diameter of about 0.01 to about 1 mm, and a circular, elliptical or rectangular cross-section. The electrodes 220, 230 can also each comprise one or more conductors that are electrically isolated from one another, such as for example bipolar or tripolar electrodes, that are maintained at different electric potentials.

The conductor 250 below the dielectric 210 is made of an electrically conducting material and has an upper surface suitable for supporting the dielectric 210 in the process chamber 110. In one configuration, the conductor 250 comprises a metal plate, such as an aluminum plate, positioned immediately below the dielectric 210. The conductor is capacitively coupled to the bottom electrode 230 through the dielectric layer that lies between the bottom electrode 230 and the conductor 250, as discussed above. The peripheral portion 255 extends beyond the perimeter of the electrodes, and may also extend beyond the peripheral edge of the substrate 50. The RF voltage applied to the bottom electrode 230 provides a second electric field component that emanates from the bottom electrode 230 in a downward direction toward the underlying conductor 250. This field component provides the capacitive coupling from the bottom electrode 230 to the underlying conductor 250. Because the bottom electrode 230 is separated and electrically insulated from the conductor 250 by the dielectric 210, the support assembly 200 functions as a capacitor and electrically couples RF power from the bottom electrode 230 to the conductor 250. Once the second field components are coupled to the conductor they are electrically conducted to the peripheral portion 255 of the conductor 250. In this manner, the dielectric 210 with the embedded bottom electrode 230 is used to generate peripheral (second) electric field components that are transmitted to the region near the periphery of the substrate 50. In addition, a DC component may be used to electrostatically "chuck" the collar 260, as discussed above.

The collar 260 is positioned on the peripheral portion 255 of the conductor 250 and may be in direct electrical contact with the peripheral portion 255. The collar 260 is sufficiently permeable to allow RF power from the peripheral portion 255 of the conductor 250 to be coupled to the plasma through the collar 260, thereby causing effects of the plasma to extend beyond the perimeter of the substrate 50. This may allow ions near the surface of the collar 260 to be energized to remove process byproducts therefrom. It is believed that this occurs because the peripheral electric field is electrically coupled from the peripheral portion 255 of the conductor 250 and provides third electric field components that extend transversely through the collar 260 to complement the field components from the top electrode 220. In this manner, the combination of the electrically conducting peripheral portion of the conductor 250 and the overlying collar 260 functions as an extension of the top electrode 220 that generates an electrical field component perpendicular to, and extending around, the periphery of the substrate 50. As a result, the effective capacitive coupling area of the top electrode 220 is increased by an electric field spanning across the collar 260. The circumferential electric field provided by the electrically coupled collar around the perimeter of the substrate 50 is believed to provide a more uniform plasma distribution across the surface of the substrate 50.

The shape and size of the conductor 250 and the diameter of the collar 260 resting on the conductor 250 are selected to increase the active area of the electrodes 220, 230 and to provide a plasma that extends beyond the periphery of the electrode. The conductor 250 may comprise a smooth and polished upper surface that can evenly electrically couple RF power from to the lower surface of the collar 260 without excessive uneven air gaps or electrical resistance therebetween. The smooth upper surface of the conductor 250 removes insulating air gaps at the interface of the conductor 250, electrodes 220, 230, and collar 260 to increase electrical coupling therebetween. In one embodiment, the conductor 250 is made from a metal plate shaped and sized to correspond to the shape and size of the substrate 50. For a circular substrate having a diameter of about 200 mm (8-inch), a suitable diameter for conductor 250 is from about 200 to about 220 mm.

The collar 260 may be an annular ring or layer of dielectric or semiconductor material covering the peripheral portion 255 of the conductor 250, that is sufficiently thin to couple RF power from the peripheral portion of the conductor 250 around the perimeter of the substrate 50. The shape and thickness of the collar 260 depend upon the electrical permeability of the material used to fabricate the collar, and in particular its absorption of electrical energy having the RF frequencies applied to the electrodes 220, 230. In one embodiment, the collar 260 is fabricated by forming a layer of dielectric or semiconductor material on the upper surface of the peripheral portion 255 of the conductor 250. The dielectric layer can be applied by flame spraying, plasma spraying, or solution coating.

In another embodiment, the collar 260 comprises a solid annular ring having a lower coupling surface polished sufficiently smooth to provide uniform and even electrical coupling to the upper surface of the conductor 250. The smooth coupling surface reduces air gaps and other electrical impedances at the interface of the conductor 250 and the collar 260. The coupling surface preferably comprises an RMS roughness of less than about 10 microns peak to peak, more preferably less than about 3 microns, and most preferably less than about 0.5 microns. Preferably, the annular ring is concentric to the electrodes 220, 230 and the conductor 250. The collar 260 can also have an upper surface capable of supporting the substrate 50. The upper surface of the collar 260 may be substantially coplanar to the upper receiving surface of the support 200 and extends to or beyond the perimeter of the substrate 50. The collar may also be removable from the support 200 to allow quick replacement of the collar when corroded or broken. In one embodiment, the thickness of the collar 260 is from about 5 to about 10 mm.

The collar 260 may be made from a dielectric material having an RF electrical field absorption sufficiently low to capacitively couple RF power from the peripheral portion of the conductor 250 through the collar 260 to the plasma at RF frequencies of about 1 to about 20 MHz. The collar 260 may be composed of dielectric materials having a dielectric constant of at least about 2 and a dielectric breakdown strength of least about 10 volts/nm. Suitable dielectric ceramic materials for fabricating the collar 260 include aluminum oxide, aluminum nitride, boron carbide, boron nitride, diamond, silicon oxide, silicon nitride, titanium oxide, titanium carbide, zirconium boride, zirconium carbide, and equivalents or mixtures thereof. Suitable polymeric materials for forming the collar 260 include polyimide, polyketone, polyetherketone, polysulfone, polycarbonate, polystyrene, polyvinylchloride, polypropylene, polyethersulfone, polyethylene, nylon, silicone, and rubber. For processes where the substrate 50 is heated, preferably, the dielectric material selected for the collar 260 is resistant to temperatures in excess of 200° C.

In another embodiment, the collar 260 is made from a semiconductor material that has low electrical resistance that allows RF field components to be transmitted or conducted through the collar 260. By semiconductor it is meant that the material has a higher electrical conductivity than insulator materials, and a lower electrical conductivity than metals. The semiconductor material has a resistivity sufficiently low to allow RF electric field components to be also electrically coupled from the conductor 250 to the collar 260 to provide a more consistent and uniform plasma sheath above the perimeter of the substrate. These RF field components even or balance out the DC potential at the edge of the substrate where edge effects are normally highly pronounced. The more balanced or level DC potential across the substrate perimeter also reduces the possibility of electrical arcing at the edge of the electrodes 220, 230. The collar 260 may have a resistivity of about $10^{-3}$ $\Omega$cm to about $10^3$ $\Omega$cm, and more preferably from about $10^1$ $\Omega$cm to about $10^2$ $\Omega$cm. Suitable semiconducting ceramic materials for fabricating the collar 260 include "doped" ceramic materials, such as mixtures of the ceramic materials described herein, such as aluminum oxide and titanium oxide, or aluminum nitride and other conduction additives.

Figure 5:
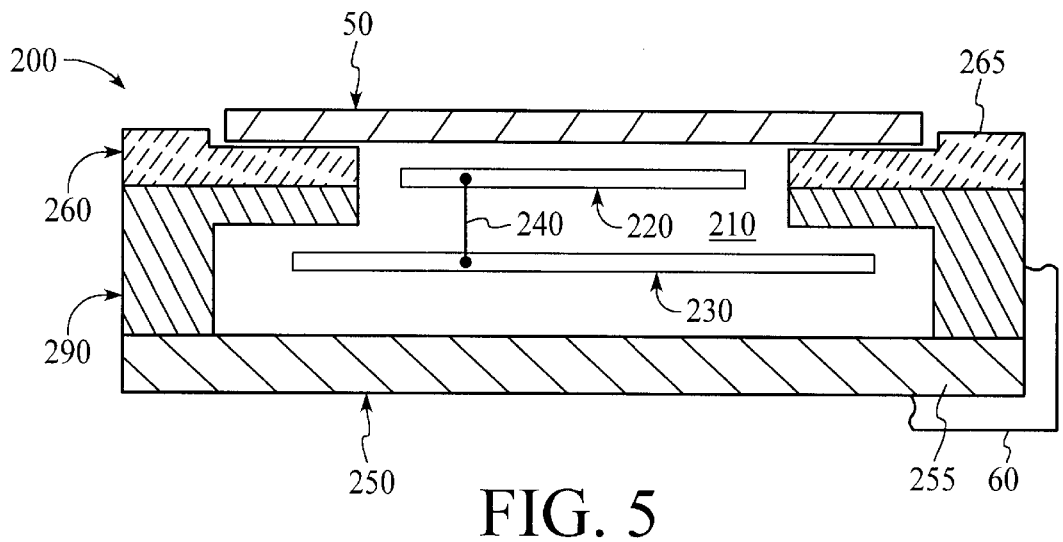
FIG. 5 is a schematic sectional side view of another embodiment of a dual electrode support usable with a substrate processing apparatus.

FIG. 5 shows another embodiment of a support 200 with a top electrode 220 and a bottom electrode 230. In this embodiment, the conductor 250 is provided with a conductor extension 290 that extends upwardly from the peripheral portion 255 of the conductor 250. When RF power is capacitively coupled to the conductor 250, it is also coupled from the peripheral portion 255 and the extension 290 through the collar 260. This coupling is believed to extend the plasma sheath beyond the substrate 50 and also to clean deposits off the surface of the collar 260. The extension 290 may be composed of the same or similar material as the conductor 250 and may be integral therewith or may serve as a metal clamp. The top surface 265 of the collar 260 may include a rim for containing the substrate 50, may be planar, or may be other shapes. The top surface 265 may also be coplanar with the top surface 215 of the dielectric 210 or at a higher level.

The plasma processing apparatus 100 of the present invention can be used to deposit, etch, or implant material on or otherwise process the substrate 50, and is particularly useful for providing uniform plasma processing across the substrate surface. To use the apparatus 100, the substrate 50 is placed in the process chamber 110, and process gas is introduced in the process chamber 110 via the gas distributor 120 at a controlled pressure. Process gas flow rates, chamber pressure, and substrate temperature depend on the process. Chemical vapor deposition (CVD) processes to deposit coatings on the substrate 50 are generally described in Chapter 9, VLSI Technology, 2nd Ed., Ed. by Sze, McGraw-Hill Publishing Co., New York, which is incorporated herein by this reference. Typical chemical vapor deposition (CVD) processes for depositing $SiO_2$ on a substrate, use process gases such as (i) silicon source gas, for example $SiH_4$ or $SiCl_2H_2$, and an oxygen source gas such as $CO_2$ or $H_2O$, or $N_2O$; or (ii) a single gas containing both silicon and oxygen such as $Si(OC_2H_5)_4$. CVD processes for depositing silicon or $Si_3N_4$ on the substrate typically use gases such as $SiH_4$, $NH_3$, $N_2$, $B_2H_6$, HCl, and $PH_3$. Other conventional CVD process gases include $NH_3$, $AsH_3$, $B_2H_6$, HCl, $PH_3$ and $SiH_4$. The apparatus 100 can also be used for plasma etching processes as generally described in *VLSI Technology, Second Edition,* Chapter 5, by S. M. Sze, McGraw-Hill Publishing Company (1988), which is incorporated herein by reference. Typical etching processes use process gases such as $BCl_3$, $Cl_2$, $SF_6$, $CF_4$, $CFCl_3$, $CF_2Cl_2$, $CF_3Cl$, $CHF_3$, $C_4F_8$, $C_4F_6$, and $C_2ClF_5$; and resist etching processes typically use oxygen-containing etchant gas to etch the resist on the substrate. Plasma processes that use $NF_3$ to clean substrates 50 are generally described in U.S. Pat. No. 5,201,990, to Chang, et al., which is also incorporated herein by reference. Typically, the process gas flow rates range from 50 to 3000 sccm; chamber pressures range from 1 mTorr to 100 Torr; and substrate temperatures range from 25 to 500° C.

Figure 6:
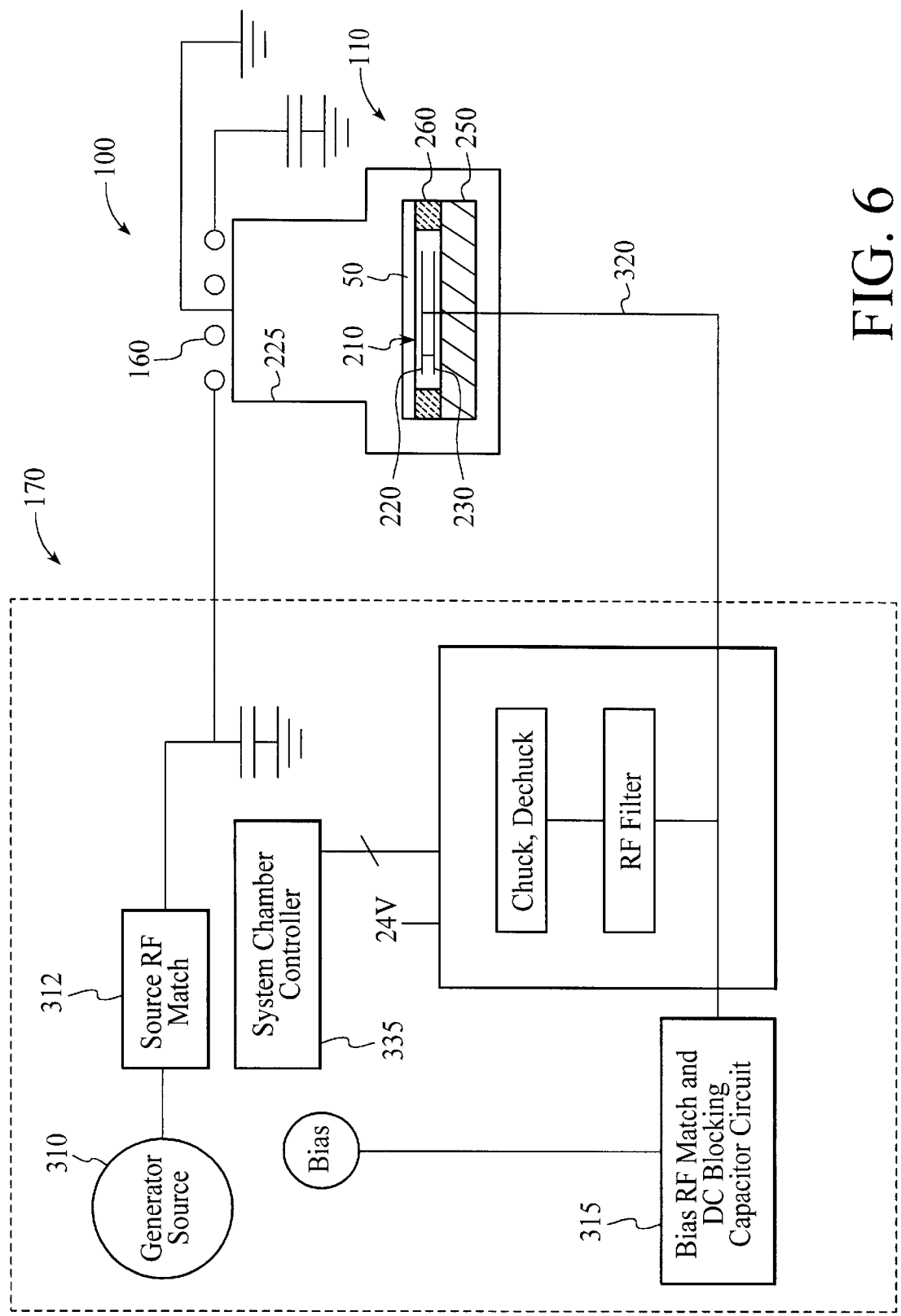
FIG. 6 is a schematic of a power supply usable to power a dual electrode substrate support.

FIG. 6 shows a voltage supply 170 suitable for use with the support 200. The voltage supply 170 comprises a generator 310 connected to a source RF match circuit 312 to provide an inductive coupling voltage to the coil 160 on the chamber 110. The voltage supply 170 also includes a bias RF match and DC blocking capacitor circuit 315 that is electrically connected to a DC chuck power supply. RF power from the circuit 315 is provided to the top electrode 220 or the bottom electrode 230 through a cable 320 at a power level of about 50 to 3000 watts. The substrate 50 is electrostatically held to the receiving surface of the dielectric 210 by the DC voltage biased top electrode 220. The voltage supply 170 can also include a system controller 335 for controlling the operation of the electrodes 220, 230 by directing a DC current, and RF current, or both, to the electrodes for chucking and dechucking the substrate 50 and for generating plasma in the process chamber 110.

Although the present invention has been described in considerable detail with regard to the preferred embodiments thereof, other embodiments are possible. For example, the collar may be integral with the sidewall of the process chamber, form a unitary structure with the support, or form a separate conductor and collar assembly that is electrically connected to the support. Other similar modifications can be made without departing from the scope of the invention. Therefore, the appended claims should not be limited to the descriptions of the preferred embodiments contained herein.

What is claimed is:

1. A support capable of supporting a substrate in a chamber, the support comprising:

(a) a dielectric covering first and second electrodes, the dielectric having a surface adapted to receive the substrate; and (b) a voltage supply adapted to supply an RF bias voltage to the first and second electrodes.

2. A support according to claim 1 further comprising a conductor below the dielectric.

3. A support according to claim 2 wherein the dielectric is adapted to capacitively couple RF power from the first or second electrode to the conductor.

4. A support according to claim 2 wherein the conductor is adapted to be maintained at a floating electrical potential.

5. A support according to claim 2 wherein the conductor comprises a peripheral portion extending beyond one of the electrodes.

6. A support according to claim 2 further comprising a collar on the conductor.

7. A support according to claim 6 wherein the collar is adapted to capacitively couple RF power between the conductor and a plasma in the chamber.

8. A support according to claim 1 wherein the first and second electrodes are separated by a layer of dielectric.

9. A support according to claim 8 wherein the first and second electrodes are electrically connected.

10. A support according to claim 1 wherein the first electrode is above the second electrode.

11. A support according to claim 1 further comprising a collar adjacent to the dielectric and wherein one of the electrodes is capacitively coupleable through the collar.

12. A support according to claim 1 wherein the first and second electrodes are electrically connected to one another.

13. A support according to claim 1 wherein the voltage supply is adapted to provide a single RF bias voltage to both the first and second electrodes.

14. A support according to claim 1 wherein the voltage supply comprises a single RF source.

15. A support according to claim 1 wherein the voltage supply is further adapted to supply a DC voltage to one or both of the electrodes.

16. A process chamber capable of processing a substrate in a plasma, the process chamber comprising:
   (a) a gas distributor adapted to introduce process gas in the chamber;
   (b) a dielectric comprising a first and a second electrode, the dielectric having a receiving surface adapted to receive the substrate;
   (c) a conductor below the dielectric;
   (d) a voltage supply adapted to supply a gas energizing voltage to one of the electrodes and an RF bias voltage to the other electrode; and
   (e) a collar on the conductor.

17. A process chamber according to claim 16 wherein the dielectric is adapted to capacitively couple one of the electrodes to the conductor.

18. A process chamber according to claim 17 wherein the conductor is adapted to capacitively couple through the collar to a plasma in the process chamber.

19. A process chamber according to claim 16 wherein the conductor has a peripheral portion and the collar is on the peripheral portion of the conductor.

20. A process chamber according to claim 19 wherein the peripheral. portion of the conductor extends beyond one of the electrodes.

21. A process chamber according to claim 16 wherein the conductor is capable of being maintained at a floating electrical potential.

22. A process chamber according to claim 16 wherein the conductor includes an upward extension.

23. A process chamber according to claim 22 wherein the collar is on the upward extension.

24. A process chamber according to claim 16 wherein the first and second electrodes are electrically connected.

25. A process chamber according to claim 16 wherein the voltage supply is further adapted to supply a DC voltage to one of the electrodes.

26. A method of supporting a substrate in a process chamber an processing the substrate in the process chamber, the method comprising the steps of:
   (a) supporting the substrate in the process chamber on a dielectric comprising first and second electrodes;
   (b) introducing process gas in the process chamber;
   (c) supplying a voltage to the first electrode to energize the process gas; and
   (d) supplying an RF bias voltage to the second electrode.

27. A method according to claim 26 further comprising electrically connecting the first and second electrodes.

28. A method according to claim 26 wherein step (c) comprises supplying a voltage to the first electrode to electrostatically hold the substrate.

29. A method according to claim 26 wherein step (c) comprises capacitively coupling the first electrode to a process electrode.

30. A method according to claim 26 wherein step (d) comprises capacitively coupling the second electrode to a conductor.

31. A method according to claim 30 comprising capacitively coupling the conductor to the energized process gas.

32. A method of supporting a substrate in a process chamber and processing the substrate in the process chamber, the method comprising the steps of:
   (a) supporting the substrate on a support in the process chamber;
   (b) introducing process gas into the process chamber;
   (c) supplying a voltage to a first electrode to energize the process gas; and
   (d) electrically connecting a second electrode to the first electrode, thereby supplying a voltage to the second electrode to remove deposits on the support.

33. A method according to claim 32 wherein step (c) comprises supplying a voltage to the first electrode to electrostatically hold the substrate.

34. A method according to claim 32 wherein step (c) comprises capacitively coupling the first electrode to a process electrode.

35. A method according to claim 32 wherein step (d) comprises capacitively coupling the second electrode to a conductor.

36. A method according to claim 32 wherein step (d) comprises capacitively coupling the second electrode to a conductor and capacitively coupling the conductor through a material to a plasma above the material.

37. A method of supporting a substrate in a process chamber and processing the substrate in the process chamber, the method comprising the steps of:
   (a) supporting the substrate in the process chamber on a dielectric covering first and second electrodes;
   (b) supplying a first RF bias voltage to the first electrode;
   (c) supplying a second RF bias voltage to the second electrode.

38. A method according to claim 37 comprising electrically connecting the first and second electrodes, thereby supplying substantially the same RF bias voltage to the first and second electrodes.

39. A method according to claim 37 comprising capacitively coupling RF power from the first or second electrode to a conductor below the dielectric.

40. A method according to claim 39 comprising capacitively coupling RF power between the conductor below the dielectric and a plasma in the chamber.

41. A method according to claim 39 comprising maintaining the conductor at a floating electrical potential.

42. A method according to claim 37 further comprising supplying a DC voltage to one or both of the electrodes.

* * * * *